United States Patent
Chae et al.

(10) Patent No.: US 7,885,111 B2
(45) Date of Patent: Feb. 8, 2011

(54) FLASH MEMORY DEVICE AND METHOD FOR PROVIDING INITIALIZATION DATA

(75) Inventors: Dong-Hyuk Chae, Seoul (KR); Young-ho Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 325 days.

(21) Appl. No.: 12/054,617

(22) Filed: Mar. 25, 2008

(65) Prior Publication Data

US 2008/0239809 A1 Oct. 2, 2008

(30) Foreign Application Priority Data

Mar. 26, 2007 (KR) .................. 10-2007-0029311

(51) Int. Cl.
*G11C 16/06* (2006.01)
(52) U.S. Cl. .............. 365/185.09; 365/200; 365/189.16
(58) Field of Classification Search ............ 365/230.03, 365/230.08, 185.09, 200, 189.16
See application file for complete search history.

(56) References Cited

U.S. PATENT DOCUMENTS

| | | | |
|---|---|---|---|
| 6,259,639 B1 * | 7/2001 | Hashizume | 365/201 |
| 6,646,930 B2 | 11/2003 | Takeuchi et al. | |
| 2005/0271045 A1 * | 12/2005 | Mo | 370/366 |
| 2007/0165468 A1 * | 7/2007 | Nishihara et al. | 365/200 |

FOREIGN PATENT DOCUMENTS

| | | |
|---|---|---|
| JP | 2001-176290 | 6/2001 |
| JP | 2002-117692 | 4/2002 |
| JP | 2004-152413 | 5/2004 |
| KR | 1020000019460 A | 4/2000 |
| KR | 1020020032340 A | 5/2002 |
| KR | 1020050108773 A | 11/2005 |

* cited by examiner

*Primary Examiner*—Vu A Le
*Assistant Examiner*—Han Yang
(74) *Attorney, Agent, or Firm*—Volentine & Whitt, P.L.L.C.

(57) ABSTRACT

A flash memory device includes a cell array and a decision unit. The cell array includes multiple regions corresponding to multiple input/output lines. Initialization data are repeatedly stored in each of the regions. The decision unit determines whether the stored data are valid based on values of bits of the stored data read from each region.

22 Claims, 7 Drawing Sheets

FLASH MEMORY DEVICE AND METHOD FOR PROVIDING INITIALIZATION DATA

CROSS-REFERENCE TO RELATED APPLICATIONS

A claim of priority is made to Korean Patent Application No. 10-2007-0029311, filed on Mar. 26, 2007, the subject matter of which is hereby incorporated by reference.

BACKGROUND OF THE INVENTION

The present invention relates to a semiconductor memory device, and more particularly, to a flash memory device having reliable initialization data and a method of providing the same.

Semiconductor memory devices are largely classified into volatile semiconductor memory devices and non-volatile semiconductor memory devices. The volatile semiconductor memory devices are characterized by fast reading and writing speeds, but stored contents disappear when no external power is applied. On the other hand, the non-volatile semiconductor memory devices retain stored contents even when no power is applied. Therefore, the non-volatile semiconductor memory devices are used to store vital contents, which must remain regardless of power supply. Examples of the non-volatile semiconductor memory devices include a mask read-only memory (MROM), a programmable read-only memory (PROM), an erasable programmable read-only memory (EPROM), and an electrically erasable programmable read-only memory (EEPROM).

Since erase and write operations are relatively complicated in MROM, PROM and EPROM, typical users may not be able to update memory contents. In comparison, erase and write operations can be performed electrically in EEPROM, which is therefore used extensively for system programming or auxiliary memory devices, which require continuous updating. A flash EEPROM, in particular, has a higher degree of integration as compared to a typical EEPROM, and is therefore used in high-capacity auxiliary memory devices. With respect to flash EEPROMs, a NAND-type flash EEPROM (hereinafter referred to as a NAND flash memory) has a higher degree of integration, as compared to other types of flash EEPROM.

A typical memory device is an integrated circuit that stores information and reads the stored information, when necessary. A flash memory device includes multiple rewritable memory cells, each of which stores one-bit data or multi-bit data. The flash memory device can improve functionality through its high degree of integration, high capacity storage and an increase of chip size. As a result, circuit line widths decrease proportionately, and manufacturing steps and associated complexity tend to increase, causing a reduction in a yield of chips.

In response to such limitations, a semiconductor memory device may include a redundancy memory cell to replace defective memory cells. Additionally, the semiconductor memory device may include various means to switch an address of a defective cell to that of a redundancy memory cell. When detecting defective memory cells during a test, for example, an address of a defective cell may be changed to that of a redundancy cell through a series of processes for cutting a fuse in a fuse box. Accordingly, even if there is a defective cell in one chip, it can be replaced with non-defective cell(s), thereby increasing yield. However, there are technologies for storing an address of a defective cell on a non-volatile memory not on a fuse program, and reading the cell while powering-up, in order to perform a repair operation.

Exemplary redundancy circuits are disclosed in U.S. Pat. No. 6,118,712, entitled "REDUNDANCY FUSE BOXES AND REDUNDANCY REPAIR STRUCTURES FOR SEMICONDUCTOR DEVICES" (issued Sep. 12, 2000), and in U.S. Pat. No. 6,850,450, entitled "FUSE BOX INCLUDING MAKE-LINK AND REDUNDANT ADDRESS DECODER HAVING THE SAME, AND METHOD FOR REPAIRING DEFECTIVE MEMORY CELL" (issued Feb. 1, 2005), the respective subject matter of which are incorporated herein by reference.

FIG. 1 is a block diagram illustrating a structure of a typical flash memory device switching a row or column address of a defective cell into row redundancy or column redundancy. When a power-up detector 160 detects power input, a repair address stored in a memory cell is read and provided to a repair controller 150. The repair controller 150 stores the repair address on a register. The repair controller 150 compares an address input during a normal program or read operation with the repair address. When the input address is the same as the repair addresses, the repair controller 150 controls a column selector 140 or a row decoder 120 to switch the input address to the row redundancy or the column redundancy.

As described above, in a typical flash memory device, the reading and storing of a repair address are performed during a power-up operation interval right after power is applied. During the power-up operation interval, because the power supply of the flash memory device is not yet stabilized, operations of logic circuits determining or maintaining logic 0 or logic 1 are unstable. However, the flash memory device 100 reads a repair address from a cell array 110 during this time. The flash memory device needs a high voltage during a read operation, and if the high voltage is not sufficient, reliability of the read data is reduced. A page buffer 130, having multiple latch circuits, detects and latches data of a cell array when there is an unstable voltage supply state. Latch operations of logic 1 or logic 0 are not reliable during an unstable state. Furthermore, a progressive defect may exist in the cell array 110, regardless of power level. Due to the above limitations, the repair address read during the power-up operation interval may include an error, which deteriorates the operational reliability of the flash memory device.

According to the above incorporated references, there is no technology that provides a reliable repair address read during an unstable voltage supply state.

SUMMARY OF THE INVENTION

The present invention provides a flash memory device for improving reliability of a repair address read when power is applied, as well as a method of repairing a defective cell.

Embodiments of the present invention provide a flash memory device including a cell array and a decision unit. The cell array includes multiple regions corresponding to multiple input/output lines. Initialization data are repeatedly stored in each of the regions. The decision unit determines whether the stored data are valid based on values of bits of the stored data read from each region.

The initialization data may include multiple bits, each bit being stored as the stored data in each of the multiple regions. A number of bits of the read data corresponding to each bit of the initialization data may correspond to a number of the multiple regions.

The decision unit may determine each bit of the initialization data by determining values of the bits of the read data corresponding to the bit of the initialization data. The cell array may include an initialization data storing region, which includes the multiple regions.

When the values of the bits of the read data corresponding to the bit of the initialization data include a number of minority bits that exceeds a predetermined threshold, the decision unit may determine that the read data is invalid. When the read data are determined to be invalid, the initialization data may be reread from the regions corresponding to the invalid read data.

The initialization data may be a repair address of a redundancy cell to replace a defective cell.

The flash memory device may further include a page buffer, a column selector, a repair address storage circuit and a repair control circuit. The page buffer detects data of the cell array to latch each bit. The column selector provides each latched bit in the page buffer to the decision unit by input/output units. The repair address storage circuit stores bits determined to be valid by the decision unit as the repair address. The repair control circuit compares an input address to the repair address of the redundancy cell stored in the repair address storage circuit, and switches the input address to the repair address when the input address is identical to the repair address.

The flash memory device may further include control logic for controlling the page buffer to reread data stored in the cell array according to whether the read data are valid or invalid. Also, the flash memory device may include a power-up detector for detecting a level of a supply voltage to provide a power-up signal to the control logic.

Other embodiments of the present invention provide an initializing method of a flash memory device. The method includes repeatedly programming each bit of initialization data of the flash memory device in multiple cell regions corresponding to multiple input/output lines, respectively; reading the programmed data and selecting one bit data from the plurality of cell regions corresponding to each bit of the initialization data; and determining whether the read data are valid based on a number of like bit values of the selected data.

The method may further include providing multiple bits based on the bit values of the selected data as the initialization data when the selected data are valid. The selected data may be reread when the selected data are invalid.

The read data may include a number of minority bits having bit values different from the like bit values. Determining whether the read data are valid may include determining that the selected data is invalid when the number of minority bits is greater than a predetermined number of bits.

The initialization data may be a repair address of a redundancy cell for replacing a defective cell. Also, the initializing method may occur during a power-up operation of the flash memory device.

Other embodiments of the present invention provide a flash memory device having a cell array including multiple regions in which bits of a repair address are repeatedly programmed as at least a single bit, respectively; a page buffer for detecting and latching data of the cell array; and a column selector for outputting each bit latched in the page buffer by an input/output unit data. A decision unit compares a number of bit values in the input/output unit data to determine whether the input/output unit data are valid or invalid, and determines one bit value of the repair address from the input/output unit data determined as valid. A repair address storage circuit stores bits determined by the decision unit as the repair address. Also, a repair control circuit switches an input address to a redundancy address when the input address is identical to the repair address after comparison.

The flash memory device may further include control logic for controlling the page buffer to reread data from the cell array when the input/output unit data are invalid. The flash memory device may also include a power-up detector for detecting a level of a supply voltage and providing a power-up signal to the control logic.

The decision unit may determine one bit value of the repair address based on logic values of multiple bits constituting the input/output unit data. When a number of minority bits, having logic values different from the logic values of a majority of the plurality of bits constituting the input/output unit data, is more than a predetermined number, the decision unit may determine that the input/output unit data is invalid. When the input/output unit data are determined to be invalid, the control logic controls the page buffer to reread the data stored in the regions corresponding to the input/output unit data.

Other embodiments of the present invention provide a memory system including a flash memory device and a memory controller controlling the flash memory device. The flash memory device includes a cell array and a decision unit. The cell array has multiple regions corresponding to multiple input/output lines. Initialization data are repeatedly stored in each of the regions. The decision unit determines whether the stored data are valid based on values of bits of the stored data read from each region.

Yet other embodiments of the present invention provide a memory system including a flash memory device and a memory controller controlling the flash memory device. The flash memory device includes a cell array having multiple regions in which bits of a repair address are repeatedly programmed as at least a single bit, respectively; a page buffer for detecting and latching data of the cell array; and a column selector for outputting each bit latched in the page buffer by an input/output unit data. A decision unit of the flash memory device compares a number of bit values in the input/output unit data to determine whether the input/output unit data are valid or invalid, and determines one bit value of the repair address from the input/output unit data determined as valid. A repair address storage circuit stores bits determined by the decision unit as the repair address. Also, a repair control circuit switches an input address to a redundancy address when the input address is identical to the repair address after comparison.

BRIEF DESCRIPTION OF THE FIGURES

The accompanying figures are included to provide further understanding of embodiments of the present invention, and are incorporated into and constitute a part of this specification. The embodiments of the present invention will therefore be described with reference to the attached drawings, in which.

DETAILED DESCRIPTION OF THE EMBODIMENTS

Figure 1:
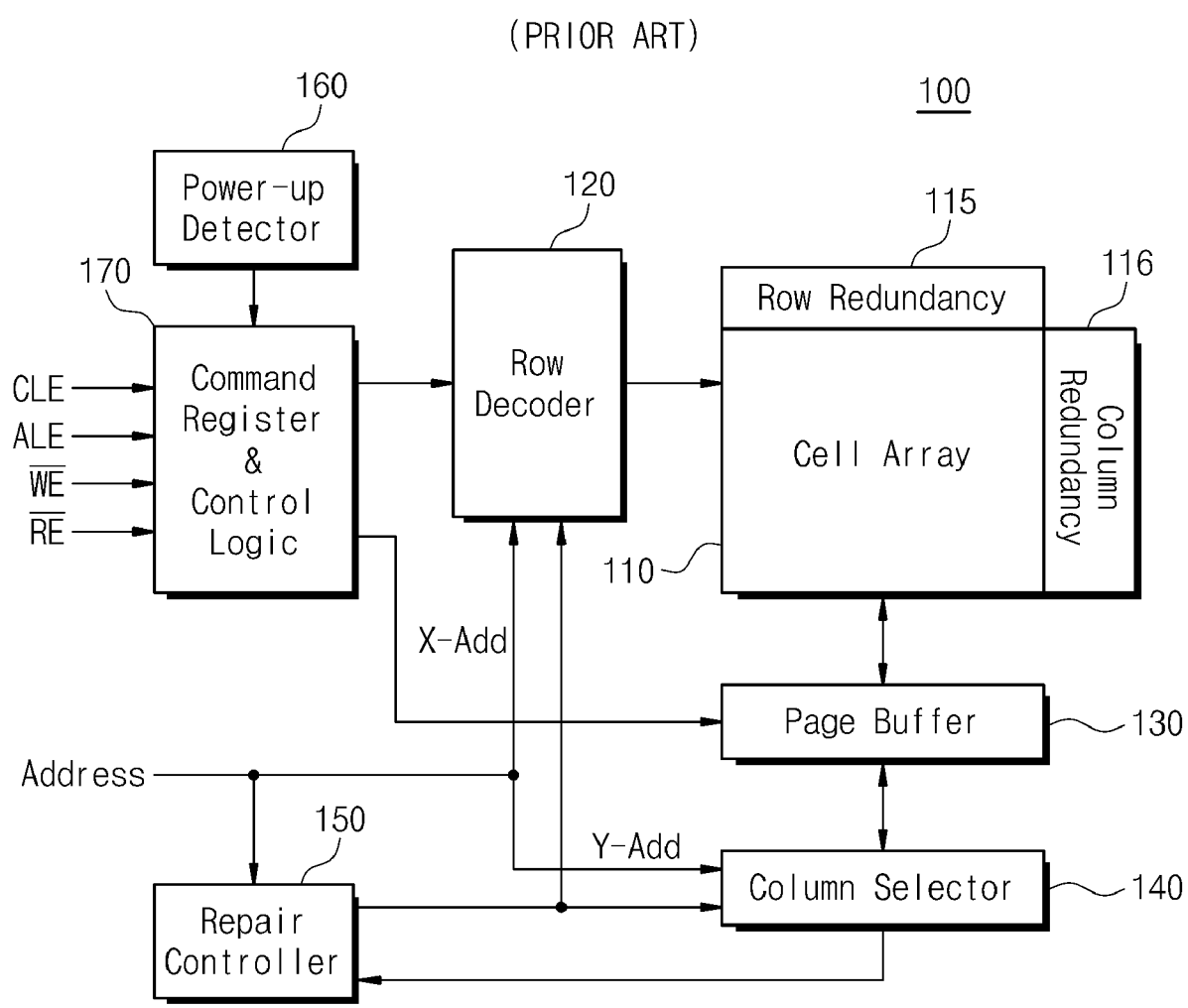
FIG. 1 is a block diagram illustrating a structure of a conventional flash memory device.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

For purposes of explanation, a NAND type flash memory device is used as an example to illustrate various features and functionalities of embodiments the present invention. Additionally, a repair address is used as one example of initialization data to illustrate various features and functionalities of embodiments of the present invention. Further, for purposes of explanation, it is assumed that a programming method repeatedly writes one-bit data to multiple regions of a cell array, respectively, as a "spread program" and data are stored by the spread program as "spread data." However, one skilled in the art would appreciate other advantages and performances of embodiments of the present invention based on such illustrations, and that the description may be incorporated in various other embodiments and applications. The detailed description is intended to cover the embodiments within the scope, technical idea and other objects described herein. Hereinafter, exemplary embodiments of the present invention will be described with reference to the accompanying drawings.

Figure 2:
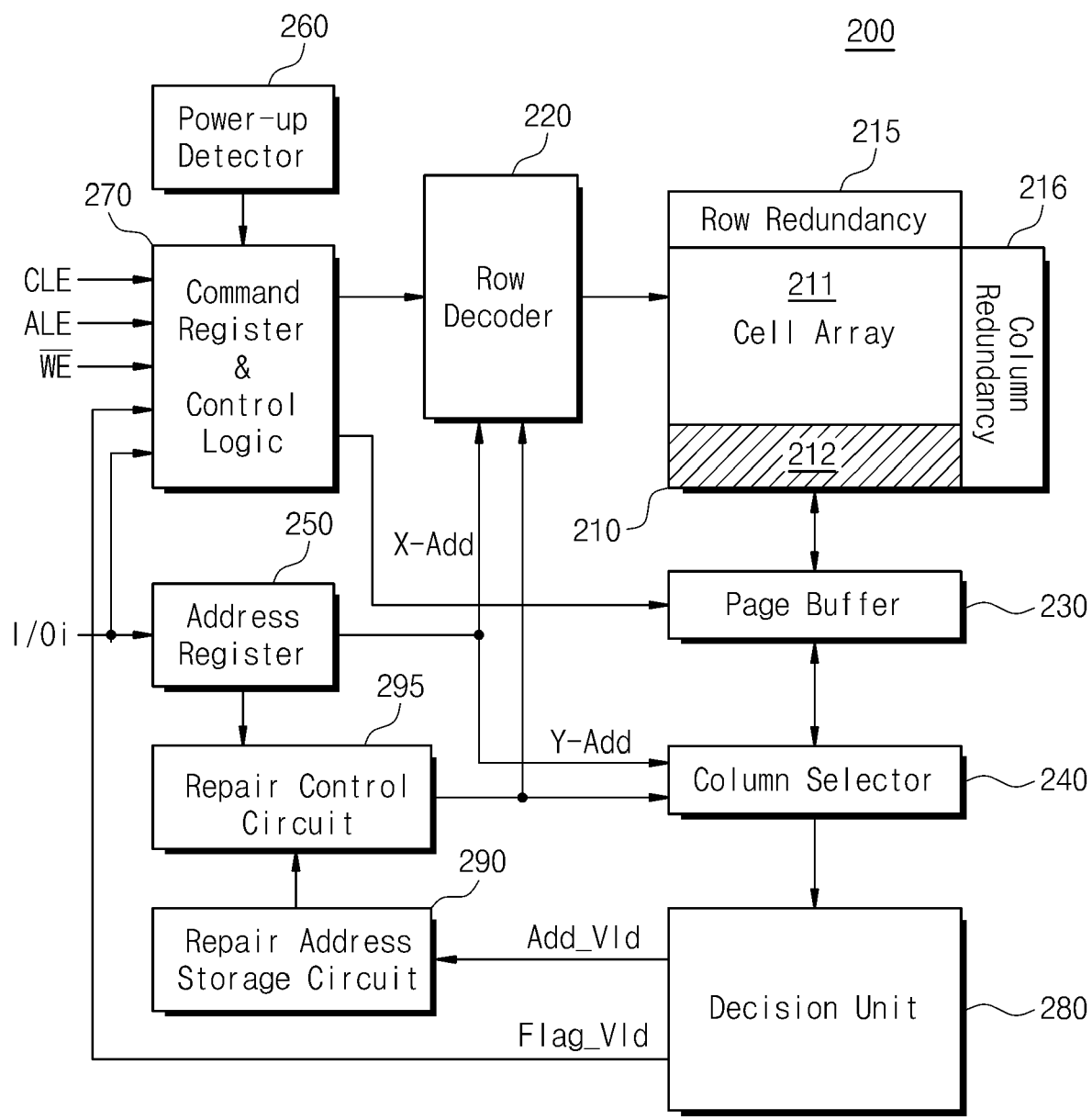
FIG. 2 is a block diagram illustrating a structure of a flash memory device for performing a repair operation, according to an exemplary embodiment of the present invention.

FIG. 2 is a block diagram illustrating a structure of a flash memory device for performing a repair operation, according to an illustrative embodiment of the present invention. A flash memory device 200 of FIG. 2 reads initialization data, such as a repair address, stored in an initialization data region 212 of cell array 210, and provides the repair address to decision unit 280. The repair address has been programmed in the initialization data region 212. For example, the repair address may be programmed multiple times in respective memory regions, where bits of the repair address are divided and stored in multiple input/output units (not shown).

The decision unit 280 determines a one-bit data value of the repair address from spread data read from the input/output units. When multiple read spread-programmed bits do not reach an appropriate standard for determining a bit value, the decision unit 280 generates a flash signal Flag_Vld to indicate that the spread data are not valid. According to the flash signal Flag_Vld, command register and control logic 270 rereads the same spread data. However, when it is determined that the spread data are valid, the spread data are decoded to obtain one bit of the repair address. Each of the bits is likewise read and decoded according to the above method to determine as the repair address, which is provided to repair address storage circuit 290, described below.

The cell array 210 includes flash memory cells, each of which is connected to a bit line and a word line. Generally, NAND flash memory cells constitute a string unit connected in series to one bit line, for example. Multiple memory cells of the string unit constitute a memory block, which may be a basic unit for an erase operation. The cell array 210 includes normal data region 211, in which general data are programmed, and initialization data region 212, in which repair data are stored. The initialization data region 212 includes a repair address corresponding to location information of a row or a column where a defective cell, detected during testing, exists. During power-up, the repair address stored in the initialization data region 212 is read and decoded. As described above, it is determined whether the decoded repair address is invalid or valid, and the repair address is stored in the repair address storage circuit 290 when the repair address is valid.

The bit values of the repair address stored in the initialization data region 212 are divided and repeatedly programmed in multiple input/output units. That is, each bit value of an address (a column repair address or a row repair address) of a defective cell is repeatedly programmed into separate regions of the initialization data region 212, respectively. For example, according to characteristics of the cell array 210 divided by a region unit corresponding to the size of an input/output bus, 1:8 repeat coding may be performed. This means that each repair address bit is extended to eight bits allocated to corresponding input/output units and programmed. For example, when one repair address bit have a value of "1," the corresponding data to be programmed extends the bit to "11111111," and each bit of the extended "11111111" is spread-programmed into the initialization data region 212. Consequently, the single repair address bit is stored as eight spread-programmed bits. Accordingly, even when an error occurs, e.g., due to a defective cell or noise of the eight bit values, restoration is still possible through a majority decision algorithm, for example. In other words, one bit is extended to multiple, duplicative bits having the same bit value and stored in the initialization data region 212. Thus, the bits are spread-programmed in a memory region through a spread program method. Through the data storing method, error correction can be applied to errors that occur intensively in a certain memory region.

Row redundancy 215 is a cell array that repairs defective rows, and column redundancy 216 is a cell array that repairs defective columns. The row redundancy 215 and/or the column redundancy 216 enable data to be stored in a normal cell instead of a defective cell. Typically, the column redundancy 216 is used more extensively than the row redundancy 215 in a NAND flash memory device because defective cells can be more easily repaired by the column redundancy 216.

Row decoder 220 selects a word line in response to a row address X-Add. The row decoder 220 provides program and verify voltages to the selected word line according to the command register and control logic 270. During a program operation, a program voltage Vpgm (e.g., about 15 V to about 20 V) and a pass voltage Vpass (e.g., about 10 V) are provided to selected and unselected word lines, respectively. During a read operation, the row decoder 220 provides a read voltage Vread (e.g., about 5 V) to a selected word line. It would be apparent to one skilled in the art that a high voltage generator (not shown) is provided for the high voltages, although not illustrated in the drawings.

Page buffer 230 operates as a write driver or a detection amplifier, according to an operating mode. For example, the page buffer 230 may operate as a detection amplifier during a read operation mode and as a write driver during a program operation mode. During power-up, a repair address stored in the initialization data region 212 is detected by the page buffer 230, and then delivered to the decision unit 280 through column selector 240.

The column selector 240 selects columns in response to a column address Y-Add, provided by predetermined unit (e.g., input/output unit). The column selector 240 may particularly select registers (not shown) of the page buffer 230. For example, during a normal read mode or a normal program mode, the column selector 240 performs the select operation in response to column address Y-Add provided by the address register 250. However, when an address of a column with a defective cell is provided, the column selector 240 switches from a column corresponding to an input column address to a column in the column redundancy 216, under the control of repair control circuit 295. During power-up, the column selector 240 is set to output spread data, latched from the page buffer 230, in input/output units.

The address register 250 temporarily stores an address input through input/output pins I/Oi. In a NAND flash memory, for example, data provided to the input/output pins I/Oi during an address input cycle are latched. The row address X-Add stored in the address register 250 during address input cycles is provided to the row decoder 220. A column address Y-Add stored in the address register 250 during address input cycles is provided to the column selector 240.

Power-up detector 260 detects a level of an internal supply voltage when power is applied to the flash memory device 200. When the detected internal voltage exceeds a predetermined level, a power-on reset signal POR (not shown) is generated to start normal operations of internal circuits and to initialize the memory device. Repair addresses may be read from the initialization data region 212 and stored in the repair address storage circuit 290 during a power-up interval when power is applied to a memory device, before the supply voltage is stabilized. Accordingly, there may be errors in the read repair address, e.g., due to an unstable supply voltage.

The command register and control logic 270 controls the page buffer 230 to read repair addresses stored in the initialization data region 212 during the power-up interval following the power input. When errors exceed an appropriate level in the spread data that are read first, the decision unit 280 generates the flash signal Flag_Vld. The command register and control logic 270 controls components, including the page buffer 230, to reread the same spread data in response to the flash signal Flag_Vld. This reread operation may be repeated until there are no errors in the read spread data or there is only a correctable error.

The decision unit 280 receives the spread data read from the initialization data region 212 and temporarily stores them. Here, the read spread data are data extended from one bit to eight bits through 1:8 repeat coding and spread programming. Whether the read spread data are valid or invalid, as well as the repair address bits, can be determined through a majority decision algorithm. That is, when the read spread data corresponding to one repair address bit is "11101111," for example, the decision unit 280 determines that the read spread data is valid data, and that the valid repair address bit is "1." Each bit of the programmed repair address may be similarly determined by the majority decision algorithm.

In an embodiment, the decision regarding whether data are valid or invalid may be controlled by a user. For example, if the read spread data are "11101000," the actual value of the corresponding address bit is not apparent. In this case, the decision unit 280 determines that the read spread data are invalid, and delivers flag signal Flag_Vld to the command register and control logic 270. In response, the command register and control logic 270 receiving the flag signal Flag_Vld causes the read operation to be repeated for the same spread data. This operation may be repeated until the spread data are determined to be valid by the decision unit 280.

The repair address storage circuit 290 stores valid repair address Add_Vld provided from the decision unit 280 when the read spread data are determined to be valid. The repair control circuit 295 receives the valid repair address Add_Vld stored in the repair address storage circuit 290. An address input to the address register 250 is compared with the valid repair address Add_Vld to determine whether the addresses are the same during normal operation after the power-up operation. When the input address and the repair address are the same, the repair control circuit 295 controls the column selector 240 or the row decoder 220 to switch an address to a redundancy region.

Accordingly, the flash memory device 200 reads the bits of a repair address that have been spread-programmed in the cell array 210. The read address bits are decoded through a majority decision method, as described above. The address bits decoded using the majority decision method may be used to correct defective memory cells and errors, e.g., caused by noise during a read operation. This operation is performed during a power-up operation interval, and the decision unit 280 thus provides reliable repair data under an unstable supply voltage. Examples of providing the repair address as initialization data according to a 1:8 spread program and an 8:1 majority decision algorithm are described above. However, in addition to repair addresses, any other type of initialization data, such as trimming information, etc., may be stored and read using the above method. Thus, for example, a register may be included to store determined trimming information.

Figure 3:
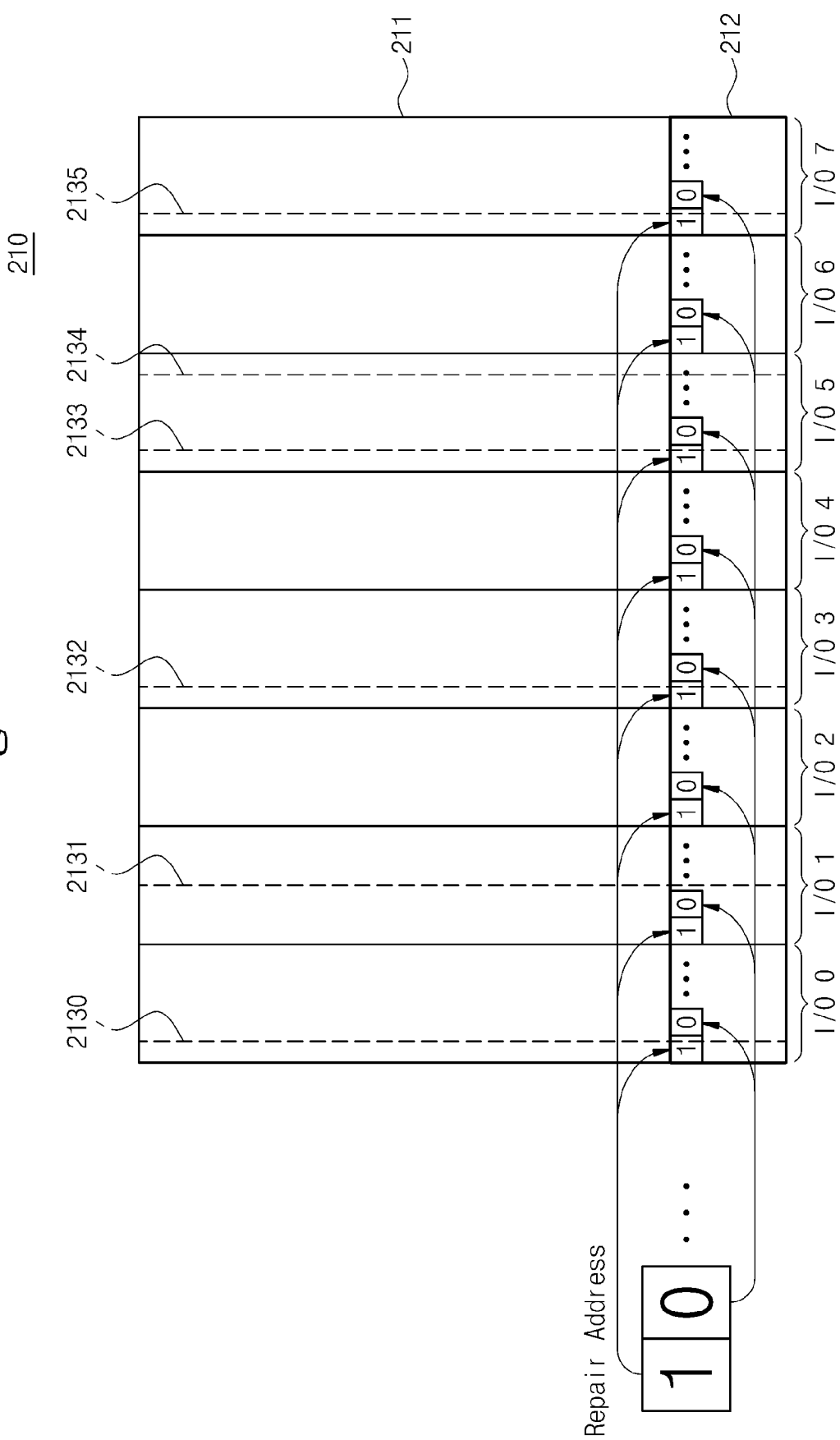
FIG. 3 is a block diagram illustrating a method of programming repair data, according to an exemplary embodiment of the present invention.

FIG. 3 is a block diagram of the cell array 210, indicating a spread program operation, according to an illustrative embodiment of the invention. Referring to FIG. 3, a repair address is stored in the initialization data region 212. As previously discussed, each address bit of the repair address is extended to multiple identical bits and stored in the initialization data region 212. Thus, the first repair address bit "1" is extended to eight bits having the same value, which are simultaneously programmed in multiple regions, divided as input/output units. The repair address bit "0" is extended to eight bits having the same value through the same method and programmed into the initialization data region 212.

A test may be performed to detect normal and defective memory cells in the cell array 210. For purposes of discussion, a column with defective memory cells is referred to as a fail column. The fail column is replaced with one column in the column redundancy 216, including normal memory cells, through a repair address. However, the flash memory device may include a progressive defect, for example, caused by deterioration of a dielectric. When there is a progressive defect, repair may not be adequately performed through a repair address. According to the present embodiment, however, there are sufficient restoring opportunities by storing one repair address bit as eight bits even when there are defects or errors. Through the majority decision algorithm, a reliable repair address may be provided. For example, referring to FIG. 3, fail columns 2130, 2132, 2133, 2134 and 2135 may include defective cells, e.g., caused by progressive defects or during a test. An error in the repair address caused by a defective cell can be corrected through the spread program and majority decision algorithm. An error caused by noise during a read operation can likewise be corrected.

Figure 4:
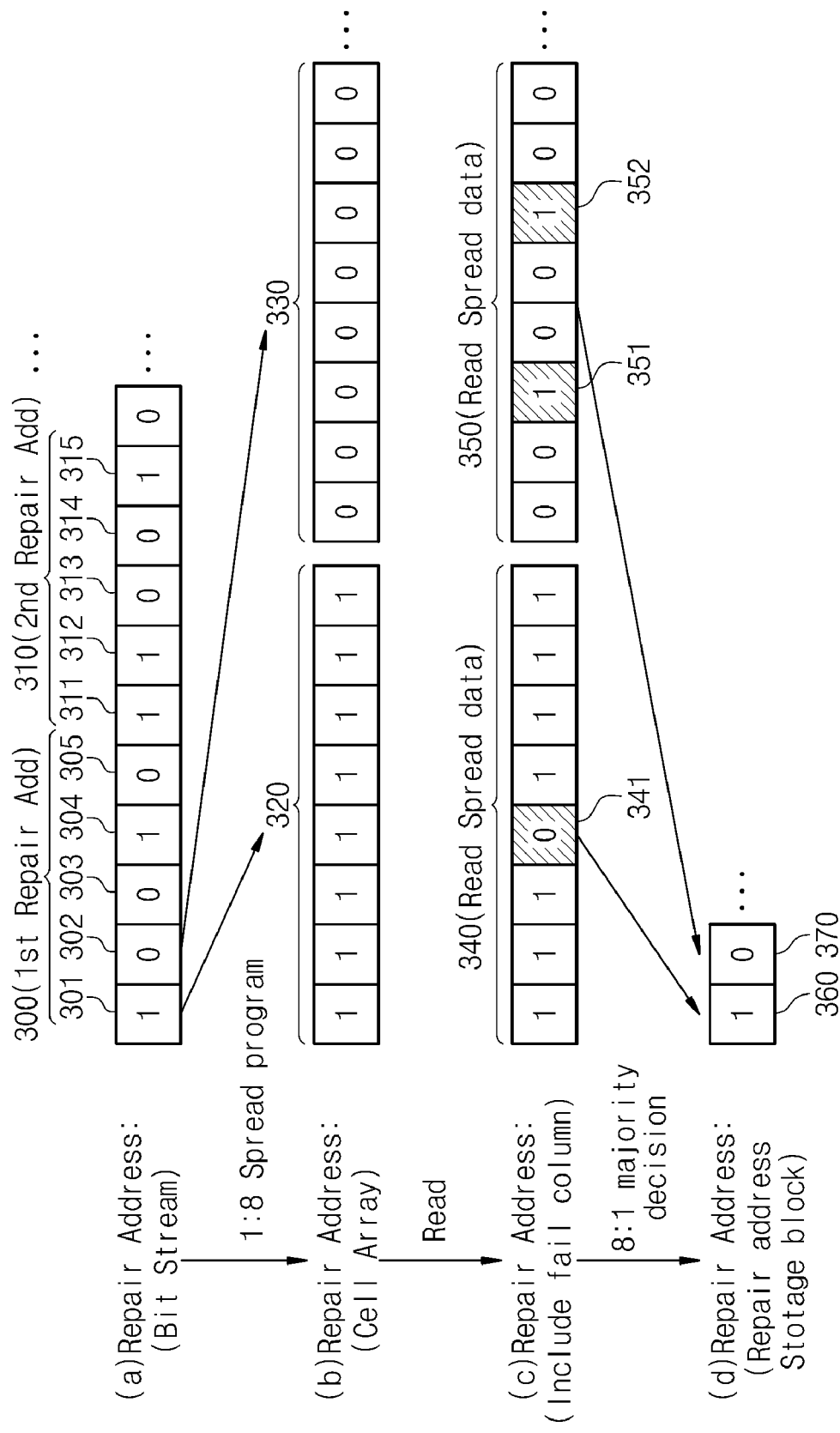
FIG. 4 is a view illustrating encoding and decoding operations of a repair address, according to an exemplary embodiment of the present invention.

FIG. 4 is a view illustrating encoding and decoding operations of a repair address programmed in an initialization data region, according to an illustrative embodiment of the invention. Referring to FIG. 4, a repair address stored in the initialization data region 212 of FIG. 2 through the spread program and majority decision algorithm following a read operation of the spread data are described in sequential steps. In particular, the spread program of the repair address, which is usually performed by a test process during the semiconductor manufacturing processes, is described through steps (a) and (b). A read operation of a repair address during a power-up operation in an actual operational environment and a majority decision operation are described through steps (c) and (d).

Step (a) illustrates a column repair address provided to a bit stream. As shown, an address of a defective column is provided in a 5-bit unit. For example, a first repair address 300 includes five address bits 301 to 305, and a second repair address 310 includes five address bits 311 to 315. The first repair address 300 and the second repair address 310 may be provided in a continuous bit stream.

Step (b) illustrates the spread program method extending the number of bits for each bit of the repair address in a test process. For example, address bit 301 is a "1," which is extended to eight bits and programmed as spread data 320 in the initialization data region 212 of cell array 210. In other words, using a 1:8 extension ratio of the spread program, the address bit 301 is repeatedly programmed to spread data 320 in the initialization data region. The address 301 is programmed at each I/O allocation area of the initialization data region 212. That is, the address bit 301 is spread-programmed as one bit in each region corresponding to I/O 0 through I/O 7. Similarly, address bit 302 of the first repair address 300 is a "0," which is extended to eight bits and programmed as spread data 330 in the initialization data region 212, as discussed above with respect to the address bit 301. Using the same method, each bit of the repair address is spread-programmed eight times, respectively.

Step (c) illustrates an exemplary read operation of the spread data, e.g., performed during a power-up operation of the memory device. Bits of the spread data corresponding to respective input/output units are read and then provided to the decision unit 280. The decision unit 280 arranges the spread data corresponding to the address bit 301 ("1") as read spread data 340, and the spread data corresponding to the address bit 302 ("0") as read spread data 350. The read spread data may include errors. As discussed above, due to a progressive defect distributed in the cell array 210 and/or noise occurring during a read operation, there may be data that includes changed bit value(s) among the eight bits of spread data. Typically, the bits of the read spread data 340 should be all logic 1s and the bits of the read spread data 350 should be logic 0s. However, there may be errors due to the above conditions, such that the read spread data 340 includes an error of one bit 341 having a "0" value, and the read spread address 350 includes an error of two bits 351, 352 having a "1" bit value, for example.

The decision unit 280 decodes the read spread data (e.g., 340 and 350) from an eight bit unit to the one bit address unit. Since the read spread data 340 and 350 of the eight bit units may include errors, as discussed above, the decision unit 280 performs a decoding operation to correct the errors. When the number of error bits is relatively high or if correction is impossible, a flash signal Flag_Vld is provided to the command register and the control logic 270, which causes the same spread data to be read again. When the read spread address is "11110000," for example, a majority decision is impossible because the number of logic "1" bits and logic "0" bits are the same. Or, when the number of error bits in the read spread address is relatively high, the reliability of the read spread data is low. For example, when the read spread data are "10001100," i.e., there are three logic "1" bits and five logic "0" bits, the data determined by the majority decision has low reliability. In other words, when the read spread data are "10001100," a determination that the bits having logic "1" are the erroneous bits is not very reliable, since in this case, the erroneous bits may actually be the five logic 0 bits.

Accordingly, in an embodiment, a maximum number of minority bits may be set to improve the reliability of spread data. For example, an algorithm of the decision unit 280 may be used to determine that a spread address is valid only when there are only two or fewer minority bits. Alternatively, an algorithm of the decision unit 280 may be used to determine that a spread address is valid only when there is only one or fewer minority bit. If the detected minority bits exceed the predetermined threshold of an acceptable number of minority bits, the decision unit 280 notifies the command register and control logic 270 with a flash signal Flag_Vld that the spread data are invalid. The command register and control logic 270 controls various components, including the page buffer 230, to reread the same spread data when the flag signal Flag_Vld indicates invalid spread data. The decision unit 280 again performs the majority decision algorithm to determine whether the reread spread data are valid or invalid.

Step (d) illustrates an exemplary 8:1 majority decision operation by the decision unit 280 of FIG. 2. Each of the read eight-bit spread data 340 and 350 is decoded to a single bit, respectively corresponding to address bits 360 and 370, based on a majority decision algorithm. The address bit 360 corresponds to repair address bit 301, having a bit value of "1," before spread programming and the address bit 370 corresponds to repair address bit 302, having a bit value of "0," before spread programming.

The spread program of the repair address and the 8:1 majority decision algorithm for the read spread data is described above. According to the majority decision algorithm for the spread data, errors, e.g., due to defective cell or noise occurring during a read operation, can be corrected. The flash memory device of the present invention can thus improve the reliability of repair addresses for defective cells.

Figure 5:
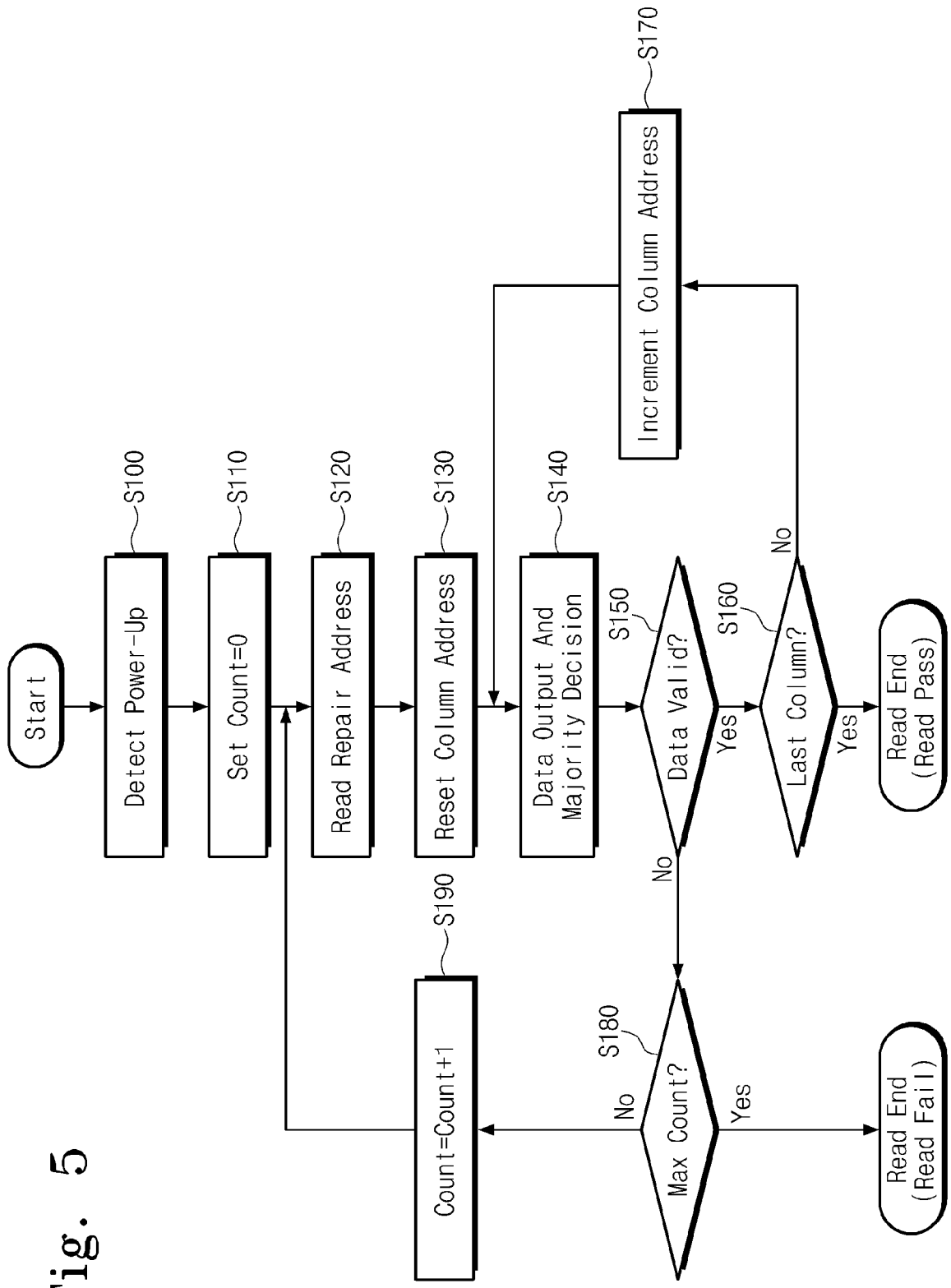
FIG. 5 is a flowchart illustrating a method of reading repair data, according an exemplary embodiment of the present invention.

FIG. 5 is a flowchart illustrating a majority decision algorithm operation for reading and decoding a spread-programmed repair address, according to an illustrative embodiment of the invention. Referring to FIG. 5, a spread-programmed repair address is read from the initialization data region during power-up and is determined to be valid or invalid. In the spread data corresponding to one bit of the spread-programmed repair address, the address bit is determined by majority decision. Reading and decoding methods are described in more detail with reference to FIG. 5.

When power is applied to the flash memory device 200, the power-up detector 260 monitors a change of the supply voltage in operation S100 to detect the power-up operation for setting an internal supply voltage. During the power-up operation, the flash memory device 200 initializes a memory device with reference to data read from the initialization data region 212. During initialization, a count value is set to 0 for initialization and a read operation of initialization data (e.g., a repair address) begins operation S110.

In operation S120, the command register and control logic 270 accesses the initialization data region 212 to read the spread-programmed repair address, for example. At this point, the repair address detected and read from the cell array is stored in latches of the page buffer 230. The repair address of a page unit, latched in the page buffer 230, is spread according to input/output units through a spread program. Accordingly, each repair address bit is spread to multiple bits (e.g., eight bits), and the spread data having multiple bits corresponding to each repair address bit can be output. For example, when a repair address has five bits, each of which is spread to eight bits, the spread data includes 40 bits (e.g., eight spread address bits times five address bits) corresponding to one repair address. The spread data can be set to be output during a first time period. That is, an output unit of the spread data may vary according to the latch capability of the decision unit 280. This operation is realized by controlling the column selector 240 in operation S130 to reset the column address.

The spread data of an eight-bit unit, output by setting the column address, are output to the decision unit 280. In operation S140, the decision unit 280 determines whether the spread data are valid or invalid, e.g., according to a majority decision algorithm. The decision unit 280 detects the number of minority bits in the eight-bit spread data corresponding to one bit of the repair address. At operation S150, the decision unit 280 counts the number of minority bits in the jeigth-bit spread data and determines whether the spread data are valid based, in part, on the detected number of minority bits.

For example, assuming that the majority decision algorithm has been set to determine invalidity when the number of minority bits exceeds two bits, the decision unit 280 determines that the data is invalid when the number of minority bits is more than two. The decision unit 280 then transmits a flash signal Flag_Vld to the command register and control logic 270 to perform the read operation again on the initialization data region. When the number of minority bits is less than two, the decision unit 280 determines that the read spread data are valid, and proceeds to determine whether the address is a final repair address among the spread-programmed column addresses in operation S160. When it is the final repair address, the read operation of the spread data is completed. However, when it is not the final repair address, the column address in incremented at operation S170 and the corresponding spread address bits latched in the page buffer 230 are output to decode the next repair address.

Returning to operation S150, when the spread address is determined to be invalid during application of the majority decision algorithm, it is determined at operation S180 whether the number of read (and reread) operations exceeds a predetermined maximum count. When the maximum count has not been exceeded, the count is incremented by one at operation S190 and the read operation is performed again, e.g., by returning to operation S120 to again read the data from the initialization data region 212, as described above. However, when the number of read operations reaches the maximum count, the read operation of the repair address is determined to have failed and the read operation is ended.

The read operation and the majority decision operation are described above. Because the flash memory device initially does not have a stable power supply, the initialization performance of a memory device can be improved by the majority decision operation. Although the repair address is described as one example of the initialization data, it would be apparent to one skilled in the art that the present invention is not limited to this exemplary embodiment of initialization data.

Figure 6:
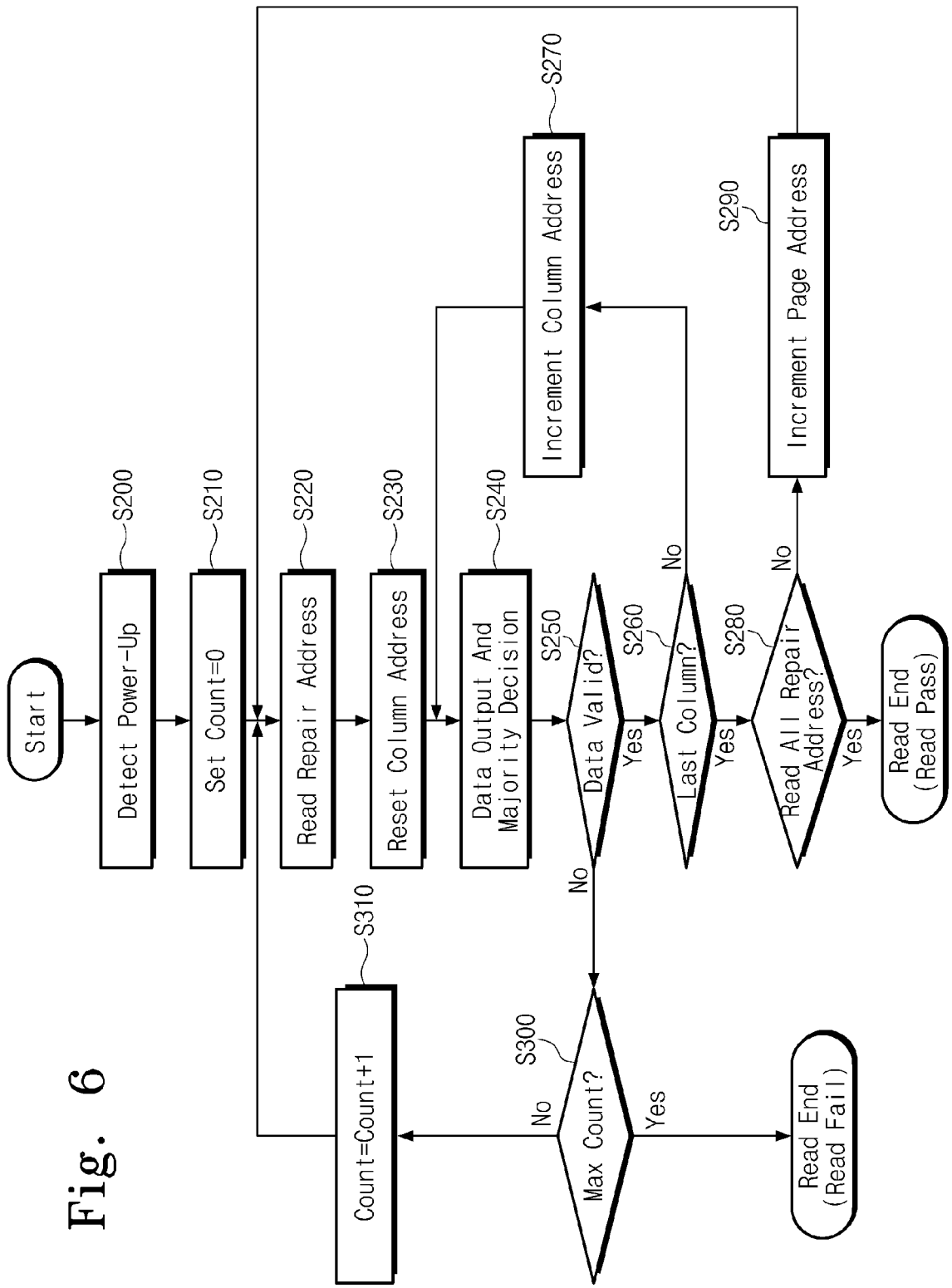
FIG. 6 is a flowchart illustrating a method for reading repair data, according another exemplary embodiment of the present invention.

FIG. 6 is flowchart illustrating read and majority decision operations for a repair address when the repair address is programmed on the cell array region in at least two pages, according to an illustrative embodiment of the invention. Referring to FIG. 6, operations S200 through S260 substantially correspond to operations S100 through S160 of FIG. 5, discussed above, with respect to data of a first page unit of the repair address. Thus, once the majority decision operation for the data of the first page unit is completed, if the repair address is programmed as more than one page unit, the read operation is performed to read the next page. Accordingly, it is determined whether the repair address bit is final in operation S280. When the read and decoded data are the final repair address bit, general operations for reading a repair address is completed. On the contrary, when the read and decoded data are not the final repair address bit, a read operation is performed to read the next repair data of the next page unit in the initialization data region 212. Accordingly, a page address is incremented in operation S290, and the process returns to operation S220 to read the next repair address.

Likewise, when the spread address is determined to be invalid during application of the majority decision algorithm at operation S250, it is determined at operation S300 whether the number of read (and reread) operations exceeds a predetermined maximum count. When the maximum count has not been exceeded, the count is incremented by one at operation S130 and the read operation is performed again, e.g., by returning to operation S220 to again read the data from the initialization data region 212, as described above. When the number of read operations reaches the maximum count, the read operation of the repair address is determined to have failed and the read operation is ended.

Figure 7:
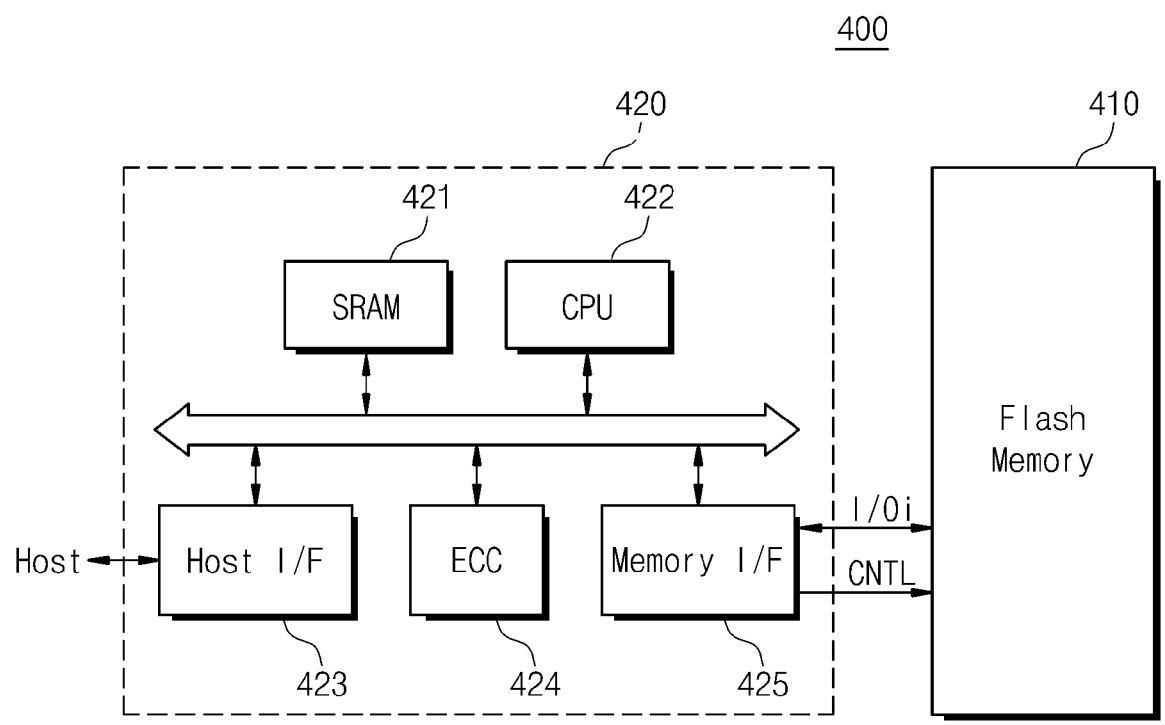
FIG. 7 is a block diagram illustrating a memory card with a flash memory device, according to an exemplary embodiment of the present invention.

FIG. 7 is a block diagram illustrating a memory card 400 of the flash memory device, according to an illustrative embodiment of the invention. Referring to FIG. 7, the memory card 400 supports a high capacity and includes flash memory device 410 and memory controller 420 to control general data exchanges between a host and the flash memory device 410. The memory card 400 executes a redundancy setting through a highly reliable repair address during initialize operation after power is applied. Accordingly, a highly reliable memory card 400 is provided.

SRAM 421 of the memory controller 420 is used as an operating memory of processing unit 422. A host interface 423 includes a data exchange protocol of a host connected to the memory card 400. An error correction block 424 detects and corrects errors in data read from the multi-bit flash memory device 410, and a memory interface 425 interfaces with the multi-bit flash memory device 410. The processing unit 422 performs general control operations to exchange data with the memory controller 420. Although not illustrated, it would be apparent to one skilled in the art that the memory cared 400 may further include ROM (not shown) to store code data for interfacing with the host and other operations.

As described above, embodiments of the flash memory device can reduce errors in initialization data, which occur in an initialize operation during a power-up interval. Accordingly, operational reliability of the flash memory device can be improved.

The repair data are spread-programmed in a cell array region and decoded according to a majority decision algorithm during a read operation, and then are provided as initialization data, such as a repair address. Accordingly, before completion of the power-up operation, e.g., before the supply voltage is stabilized, a flash memory device and a system capable of storing a repair address with high reliability is provided.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A flash memory device, comprising:
   a cell array including a plurality of regions, corresponding to a respective plurality of input/output lines, for storing initialization data comprising a plurality of bits, each bit of the initialization data being extended to correspond-ing multiple bits, which are respectively stored in the plurality of regions, wherein the initialization data comprise a repair address of a redundancy cell to replace a defective cell; and
   a decision unit for determining whether each bit of the initialization data is valid based on a majority decision algorithm using the corresponding multiple bits of the stored data read from each region.

2. The flash memory device of claim 1, wherein a number of bits of the read data corresponding to each bit of the initialization data corresponds to a number of regions of the plurality of regions.

3. The flash memory device of claim 2, wherein the decision unit determines each bit of the initialization data by determining values of the bits of the read data corresponding to the bit of the initialization data.

4. The flash memory device of claim 3, wherein, when the values of the bits of the read data corresponding to the bit of the initialization data include a number of minority bits that exceeds a predetermined threshold, the decision unit determines the read data to be invalid.

5. The flash memory device of claim 4, wherein, when the read data are determined invalid, the initialization data are reread from the regions corresponding to the invalid read data.

6. The flash memory device of claim 5, further comprising:
a page buffer for detecting data of the cell array to latch each bit;
a column selector for providing each latched bit in the page buffer to the decision unit by input/output units;
a repair address storage circuit for storing bits determined to be valid by the decision unit as the repair address; and
a repair control circuit for comparing an input address to the repair address of the redundancy cell stored in the repair address storage circuit, and for switching the input address to the repair address when the input address is identical to the repair address.

7. The flash memory device of claim 6, further comprising:
a control logic for controlling the page buffer to reread data stored in the cell array according to whether the read data are valid or invalid.

8. The flash memory device of claim 7, further comprising:
a power-up detector for detecting a level of a supply voltage to provide a power-up signal to the control logic.

9. The flash memory device of claim 1, wherein the cell array comprises an initialization data storing region, which includes the plurality of regions.

10. An initializing method of a flash memory device, comprising:
extending each bit of initialization data of the flash memory device to multiple bits;
programming the multiple bits corresponding to each bit of the initialization data in a plurality of cell regions corresponding to a plurality of input/output lines, respectively;
reading the programmed data and selecting the multiple bits from the plurality of cell regions corresponding to each bit of the initialization data; and
determining whether the read data are valid using a majority decision algorithm for each bit of the initialization data based on a number of like bit values among the selected multiple bits corresponding to each bit of the initialization data, wherein the initialization data comprise a repair address of a redundancy cell to replace a defective cell.

11. The method of claim 10, further comprising:
providing a plurality of bits based on the bit values of the selected data as the initialization data when the selected data are valid.

12. The method of clam 11, further comprising:
rereading the selected data when the selected data are invalid.

13. The method of claim 10, wherein the read data comprises a number of minority bits having bit values different from the like bit values, and
wherein determining whether the read data are valid comprises determining that the selected data is invalid when the number of minority bits is greater than a predetermined number of bits.

14. The method of claim 10, wherein the initializing method occurs during a power-up operation of the flash memory device.

15. A flash memory device comprising:
a cell array including a plurality of regions in which a repair address comprising a plurality of bits is programmed, each bit of the repair address being extended to corresponding multiple bits and the multiple bits being stored as spread data in the plurality of regions, respectively;
a page buffer for detecting and latching the spread data of the cell array;
a column selector for outputting the spread data latched in the page buffer by input/output unit;
a decision unit for comparing bit values of the multiple bits of the spread data in the input/output units to determine whether the spread data are valid or invalid, and determining one bit value for each bit of the repair address when the spread data are determined as valid;
a repair address storage circuit for storing the bit values determined by the decision unit as the repair address; and
a repair control circuit for switching an input address to a redundancy address when the input address is identical to the repair address after comparison.

16. The flash memory device of claim 15, further comprising:
a control logic for controlling the page buffer to reread data from the cell array when the spread data are invalid.

17. The flash memory device of claim 16, further comprising:
a power-up detector for detecting a level of a supply voltage and providing a power-up signal to the control logic.

18. The flash memory device of claim 15, wherein the decision unit determines one bit value of the repair address based on logic values of the multiple bits constituting the spread data.

19. The flash memory device of claim 18, wherein, when a number of minority bits, having logic values different from the logic values of a majority of the multiple bits constituting the spread data, is more than a predetermined number, the decision unit determines the spread data to be invalid.

20. The flash memory device of claim 19, wherein, when the spread data are determined to be invalid, control logic controls the page buffer to reread the regions corresponding to the spread data.

21. A memory system comprising:
the flash memory device of claim 1; and
a memory controller controlling the flash memory device.

22. A memory system comprising:
the flash memory device of claim 15; and
a memory controller controlling the flash memory device.

* * * * *